United States Patent [19]
Moe et al.

[11] Patent Number: 4,850,381
[45] Date of Patent: Jul. 25, 1989

[54] MACHINE FOR STRIPPING WAFERS

[75] Inventors: Rolf Moe, c/o Bjorne Enterprises, Inc., 23595 Cabot St., Suite 111, Hayward, Calif. 94545; David J. Corriea, Hayward; John E. Premeau, Fremont, both of Calif.

[73] Assignee: Rolf Moe, Alameda, Calif.

[21] Appl. No.: 150,669

[22] Filed: Feb. 1, 1988

[51] Int. Cl.$^4$ .............................................. B08B 3/02
[52] U.S. Cl. ...................................... 134/62; 134/95; 134/134; 134/140; 134/159
[58] Field of Search ............... 134/62, 66, 69, 77, 134/85, 95, 102, 134, 140, 159

[56] References Cited

U.S. PATENT DOCUMENTS

| | | | |
|---|---|---|---|
| 1,432,578 | 10/1922 | Thomas et al. | 134/134 |
| 3,970,471 | 7/1976 | Bankes et al. | 134/134 X |
| 4,119,108 | 10/1978 | Alexander | 134/62 |
| 4,208,760 | 6/1980 | Dexter et al. | 15/302 |
| 4,282,825 | 8/1981 | Nagatomo | 134/66 X |
| 4,722,355 | 2/1988 | Moe et al. | 134/131 X |

Primary Examiner—Frankie L. Stinson
Attorney, Agent, or Firm—Julian Caplan

[57] ABSTRACT

Apparatus for stripping photoresist and other coatings from integrated circuit wafers comprises a series of vertically positioned casings with rotary turrets within each casing each accommodating approximately 10 wafers. Wafers are received in conventional "boats", lifted one at a time and inserted in a pocket in the first turret. The turret indexes intermittently, immersing the wafer in solvent until it travels almost a full 360°; the wafer is then lifted from the first turret and inserted in a second turret which immerses the wafer during another almost 360° travel in additional solvent. Toward the end of travel in the second turret a spray nozzle strips all remaining photoresist from the wafer. The wafer is then lifted from the second turret and inserted in a first pocket, optionally containing alcohol. The wafer is then lifted from the first pocket and inserted in a third turret which immerses the wafer in de-ionized water, such water being sprayed on the wafer to rinse away all stripper and/or alcohol. Next the wafer is inserted in a second pocket where an air or nitrogen spray dries the wafer. The wafer is then deposited in a second boat.

19 Claims, 8 Drawing Sheets

FIG.—1

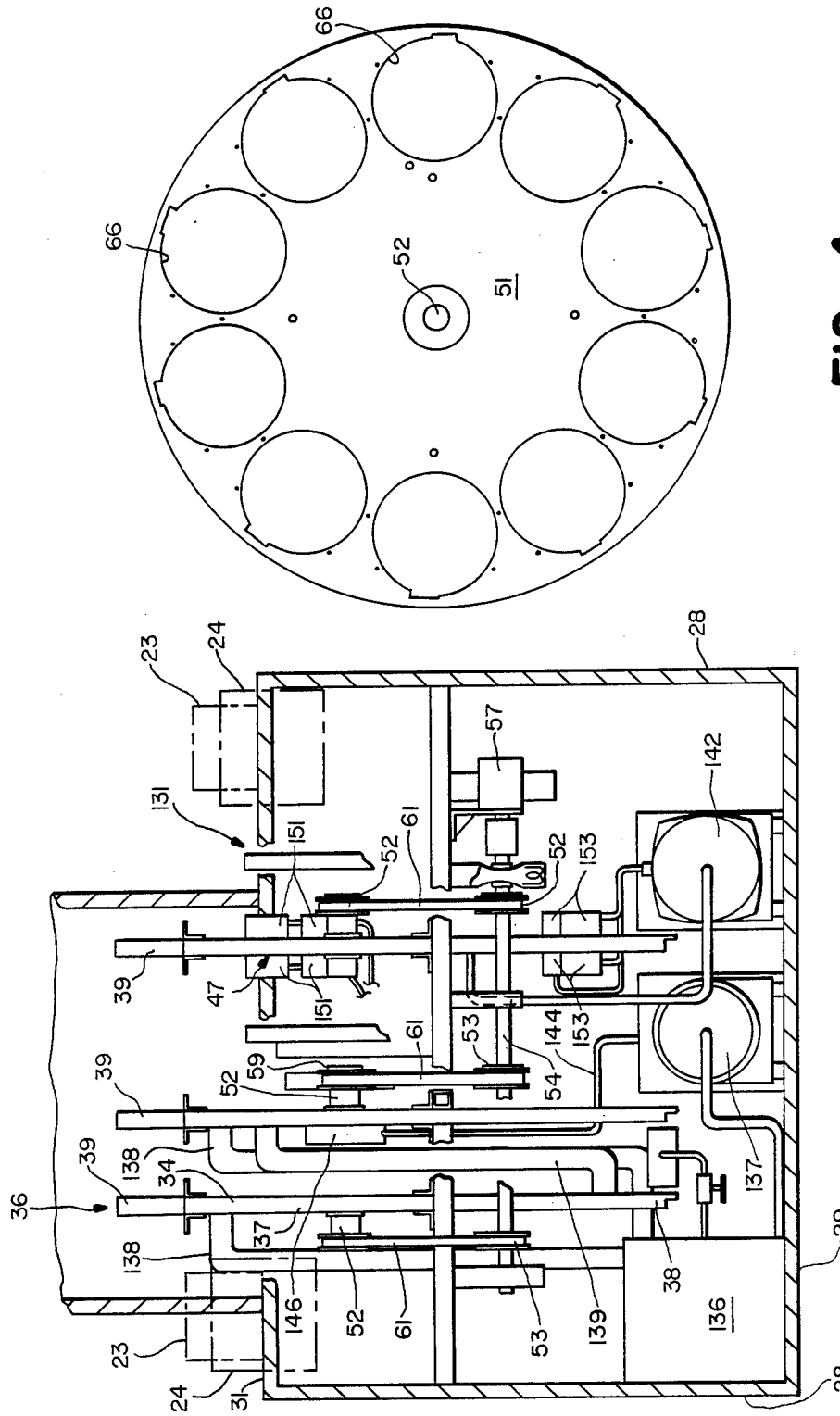

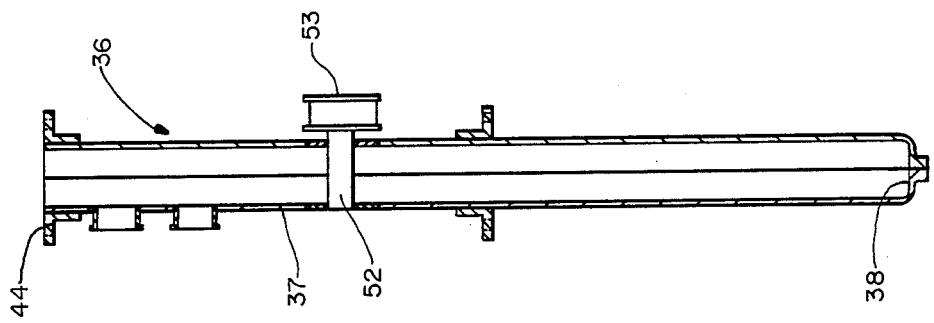
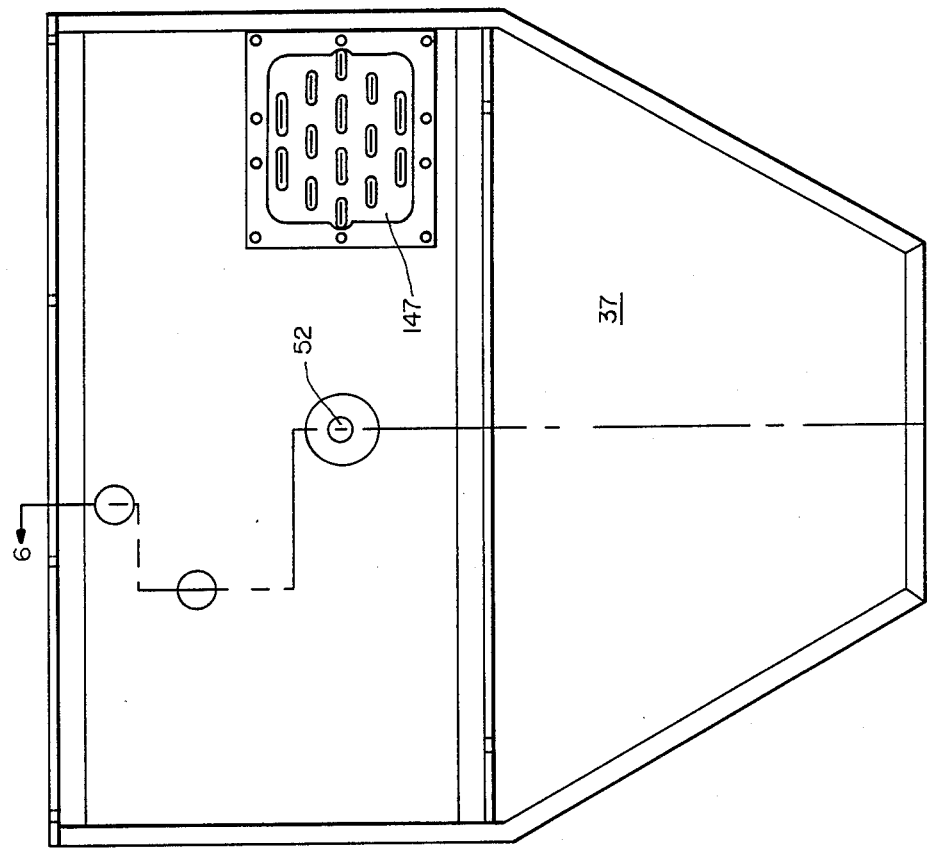

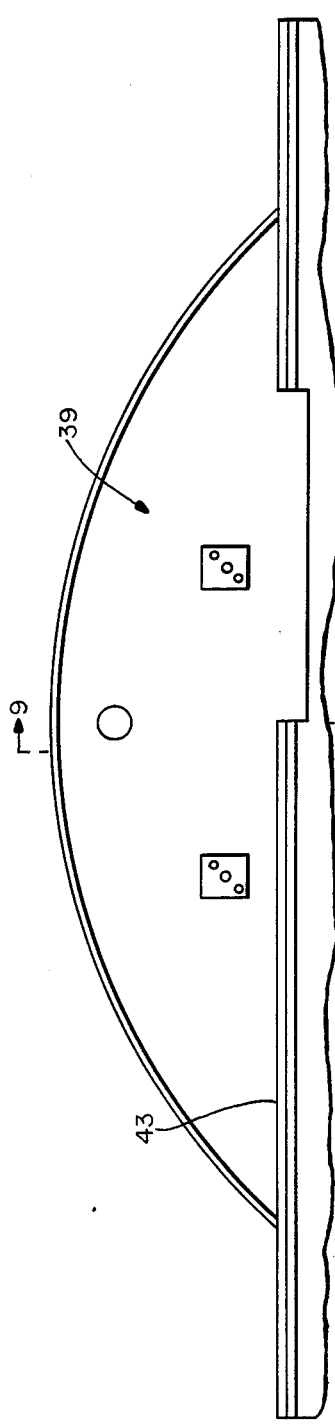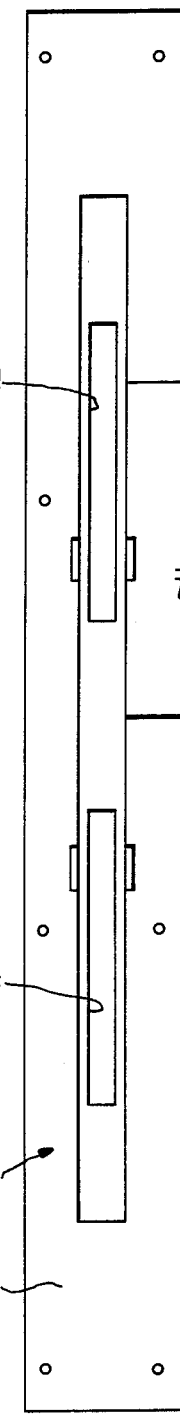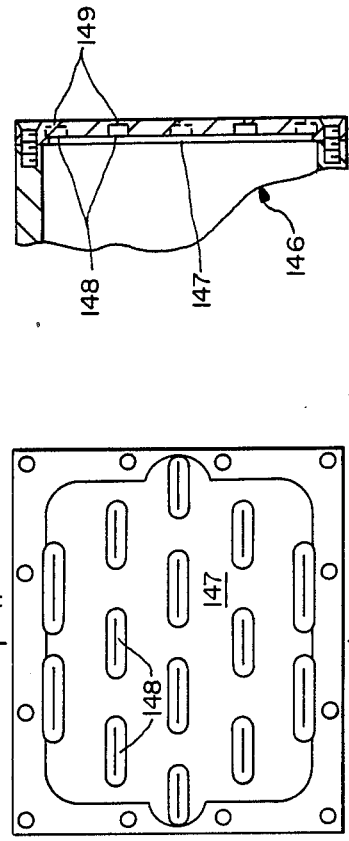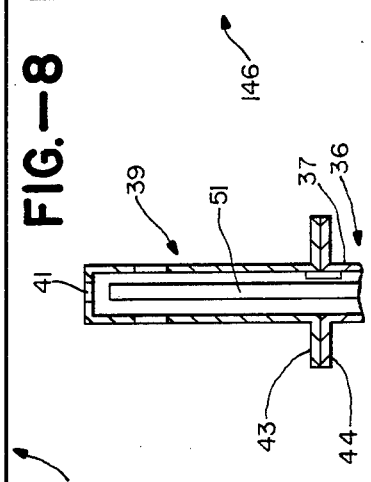

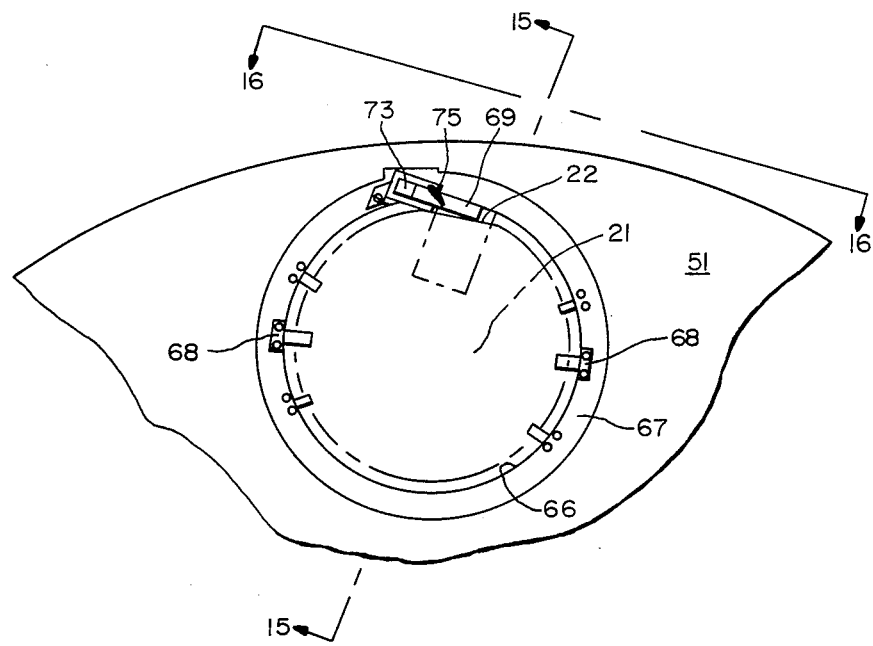
FIG.—14
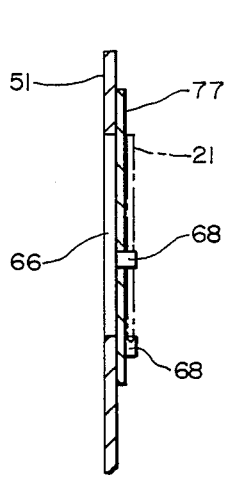 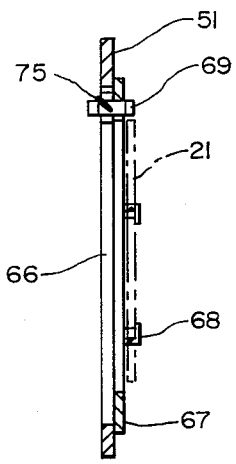 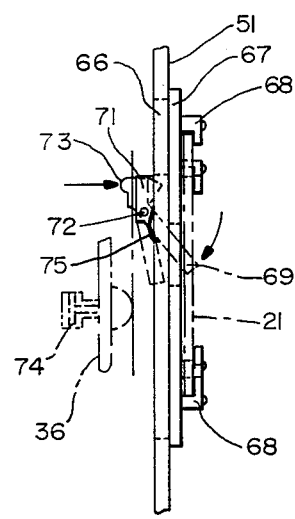
FIG.—15  FIG.—15A  FIG.—16

MACHINE FOR STRIPPING WAFERS

CROSS-REFERENCE TO RELATED APPLICATION

Reference is made to a co-pending application of applicants entitled WAFER TRANSFER MECHANISM, U.S. Pat. Ser. No. 150,784, filed Feb. 1, 1988. The mentioned application claims that portion of the disclosure of this application which lifts, transfers and lowers wafers from one station to the next as hereinafter described.

BACKGROUND OF THE INVENTION

1. Field of the Invention

This invention relates to a new and improved machine for stripping baked photoresist from wafers used in the production of integrated circuit chips. More particularly, the invention relates to a machine which lifts each wafer from a boat, immerses the wafer in stripper solvent, optionally dips the wafers one at a time in an alcohol bath, rinses the wafer in deionized water or the like, dries the wafer and then deposits it in a boat for transportation to other processing facilities. The invention is characterized in that the stripping and rinsing steps are conducted by depositing wafers one at a time in vertically disposed turrets which are intermittently rotated.

2. Description of Related Art

Heretofore, wafers have been loaded into trays, commonly termed "boats", containing many wafers. The boats with the wafers still retained therein have been treated in machines where a stripping solution is circulated around the wafers. The boats are then placed in rinsing and drying equipment. The wafers remain in the boats and the boats are individually transferred from one piece of equipment to the other.

An individual means for cleaning wafers is shown in Inoue Ser. No. 4,458,703, but the mechanism is quite different from that described herein.

A co-pending application of Rolf Moe and David Correia, Ser. No. 766,708, filed 8/19/85, now U.S. Pat. No. 4,722,355, issued Feb. 2, 1988, shows stripping of wafers individually, but again in a totally different manner.

SUMMARY OF THE INVENTION

A vertically positioned first turret is intermittently advanced from position to position within a housing maintained substantially full of stripping solution. Wafers are lifted from boats one at a time and inserted in pockets in the first turret, being immersed in solvent during a major portion of their travel. Preferably there is a second turret substantially the same as the first into which the individual wafers are immersed in solvent after they have traversed the first turret. Near the conclusion of travel in the second turret, high-pressure jets of stripping solvent are directed against the surface of the wafers to flush away any remaining photoresist. The next station is a pocket, preferably filled with alcohol or other cleaning liquid. The wafers leaving the second turret are transferred one at a time and inserted in the pocket for a brief interval. Thereupon the wafer is lifted from the pocket and deposited in a third turret similar to the first two where the wafer is immersed and sprayed with de-ionized water or similar rinsing substance. After the wafer has completed its travel in the third turret it is lifted and inserted in a dryer pocket where it is subjected to jets of hot air or nitrogen. Thereupon the wafer is lifted from the second pocket and deposited in a boat which may be transferred to another station for subsequent treatment of the wafers contained therein.

Other objects of the present invention will become apparent upon reading the following specification and referring to the accompanying drawings in which similar characters of reference represent corresponding parts in each of the several views.

IN THE DRAWINGS

FIG. 3 is a reduced dimensional view taken substantially along the line 3—3 of FIG. 2, with certain portions of the machine removed for clarity of illustration.

FIG. 4 is an elevational view of one of the turrets of the machine.

FIG. 5 is a side elevational view of the housing for one of the turrets.

FIG. 6 is a sectional view taken substantially along the line 6—6 of FIG. 5.

FIG. 7 is a side elevational view of the shroud for one of the turret housings.

FIG. 8 is a top plan view thereof.

FIG. 9 is a sectional view taken substantially along the line 9—9 of FIG. 7.

FIG. 10 is a side elevational view of a nozzle used to flush photoresist from the wafers at the conclusion of the soaking operation.

FIG. 11 is a sectional view taken substantially along the line 11—11 of FIG. 10.

FIG. 14 is an enlarged sectional view through a turret pocket, showing means for retaining the wafer within the pocket.

FIGS. 15 and 16 are, respectively, views taken substantially along the lines 15—15 and 16—16 of FIG. 14.

FIG. 15A is a view similar to FIG. 15 showing a backing plate for a pocket of a turret used in the second solvent turret.

Figure 17:
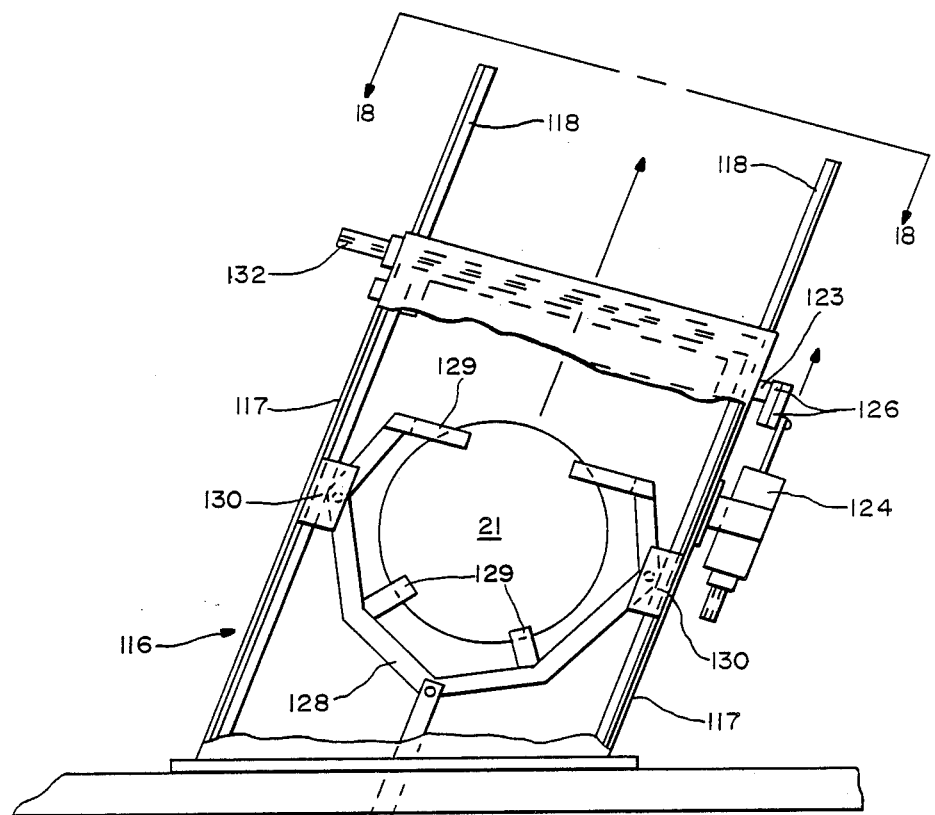

FIG. 17 is a side elevational view of a pocket in accordance with the present invention partially broken away to reveal internal construction.

Figure 18:
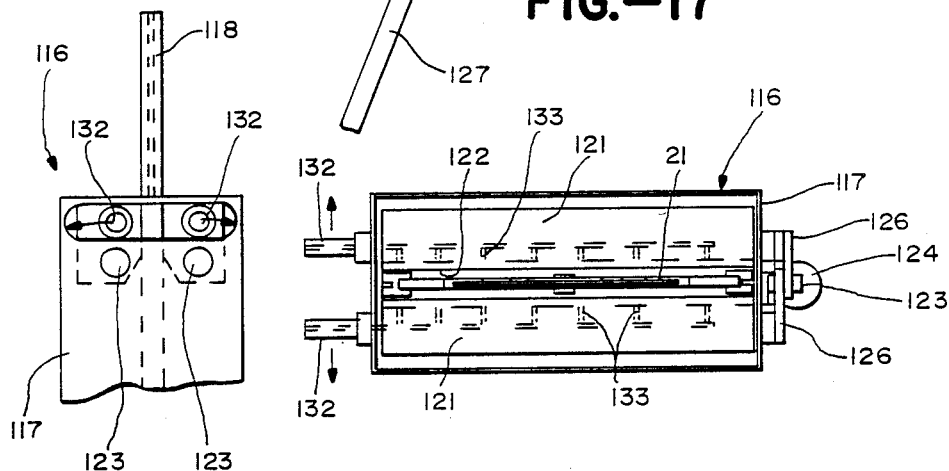

FIG. 18 is a view taken substantially along the line 18—18 of FIG. 17.

Figure 19:
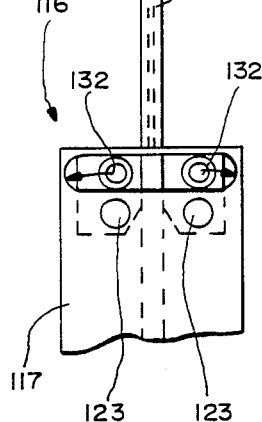

FIG. 19 is a fragmentary elevational view taken from the left of FIG. 18.

DESCRIPTION OF PREFERRED EMBODIMENTS

Round, thin wafers 21 are used in the manufacture of integrated circuit chips. Such wafers generally have at least one flat edge 22. Cassettes or trays such as input boat 23 are compartmentalized to hold a plurality of such wafers 21. It is assumed that the wafers 21 have been coated with baked photoresist material at the inception of use of this machine. The function of the machine is to remove the photoresist.

Various stripper compounds are commercially available; the present invention will function with substantially any of these compounds. It will be understood that the stripper material is preferably heated to a desired temperature such as 100° C.

A substantially rectangular, elongated frame 26 has bottom 27, end 28 and side 29 members. On the left side as viewed in FIG. 3 is an input shelf 31 upon which an indexer 24 supporting a boat 23 of untreated wafers rests. On the opposite end of the machine is an output shelf 32 in which another indexer 24 and boat 23 are positioned, the latter being filled with wafers one at a time after they have been stripped. Such indexers 24 are commercially available in the semi-conductor industry, a suitable indexer, for example, being Cybco Model 2660 manufactured by Siltec Corporation, Siltec Instrument Division. The function of the indexer 24 is to advance (or retract) boat 23 the distance of one compartment so that individual wafers 21 may be withdrawn for stripping or re-inserted after being stripped by transfer means hereinafter described. Since the indexer is well known in the industry, detailed illustration and description have been considered unnecessary.

Located within frame 26 is a vertically disposed first turret housing or casing 36 which has sides 37, one of the sides being formed with an inward turned edge 38, which is joined to the opposite side 37, as best shown in FIGS. 5 and 6. The top of housing 36 is open and is provided with a shroud 39 which is segment shaped in side elevation. The lower edge of shroud 39 has a flange 43 which fits on the flange 44 of housing 36 to provide a casing which is closed except for the openings 41, 42. Shroud 39 has a first opening 41 for insertion of wafers and a second opening 42 for removal thereof.

Figure 1:
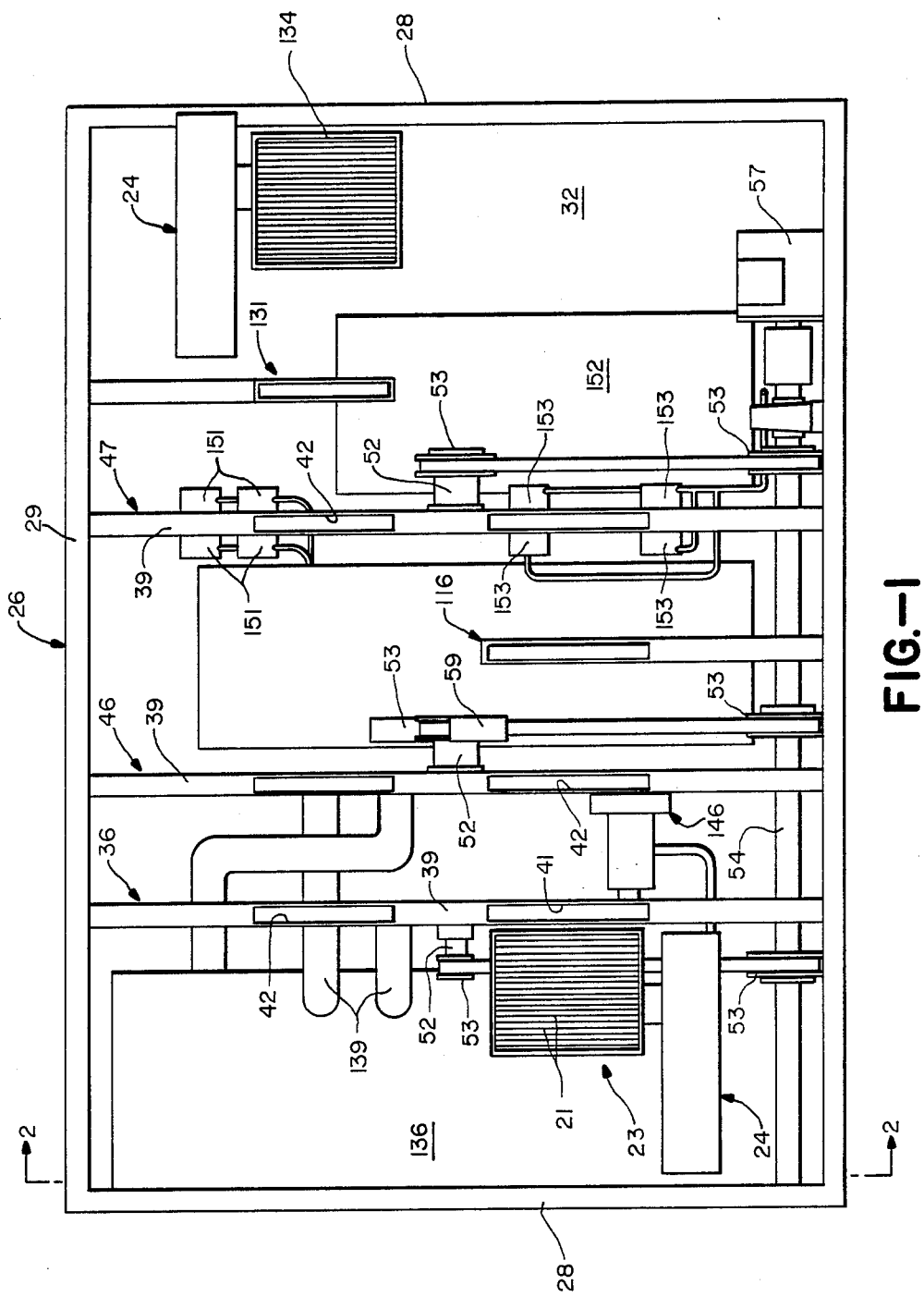
FIG. 1 is a top plan view of the machine with some of the parts on the upper portion thereof removed for clarity of illustration.

Parallel to housing 36 is a second housing 46 and spaced to the right of housing 46 as viewed in FIG. 1 is third housing 47, both housings 46 and 47 being provided with shrouds 39, similar to that of the first turret housing.

Within each of the housings 36, 46, 47 is a turret 51 which is substantially a stainless steel sheet connected to a shaft segment 52 which extends outside the housing. The shafts 52 are driven through pulleys 53 from a longitudinally extending countershaft 54 driven, in turn, by pulleys 56 from a stepped or intermittent motor 57. The direction of rotation of the turret 51 within housing 46 is opposite that in housings 36 and 47 as is accomplished by use of idler pulley 59. The various belts 61 are shown in the accompanying drawings and are not otherwise separately identified.

Each turret 51 is formed with a plurality of pockets 66 shaped to receive a wafer 21. As best shown in FIGS. 14–16, a rim 67 surrounds the circular opening in the pocket and attached to rim 67 are clips 68 shaped to receive a part of the edge of a wafer when the latter is inserted through an opening 41 or removed through an opening 42. Since it is understood that the turret 51 is intermittently rotated and in a substantial portion of its travel is inverted, a detent 69 is attached to the rim 67 adjacent the periphery of the turret 51, the detent 69 being attached to brackets 71 by a pivot 72. One end of detent 69 is formed with a cam follower 73. As shown in FIG. 16, each housing 36, 46, 47 adjacent openings 41, 42 is provided with a retractable actuator 74 which, on engaging the follower 73, pivots the detent 59 out of operative position against the force of a return spring 75 which normally biases the detent into the full line position shown in FIG. 16. One side of turret 51 in housing 46 is closed off by a backing 77 which helps to retain the wafer in place when it is opposite nozzle 146 (see below). In the first and third turrets 36 and 47, the wafers are soaked in solvent or de-ionized water sprayed against both surfaces of the wafer and hence there is no need for backing to the pockets 66 in the particular turrets used in first and third housings 36 and 47.

From the foregoing it will be seen that as the motor 57 turns countershaft 54 one step, the turrets 51 in the housings 36, 47 are turned the space of one pocket 66. In other words, each pocket comes into registry with the opening 41 for insertion of a wafer, is then intermittently revolved downward in its respective housing, being immersed in stripper solution and then is brought up to the discharge opening 42 and removed. The stripper solution is stored in a sump 136 inside frame 26 and is drawn out of the sump by a stripper pump 137 and pumped by tube 144 to the casing 46. Overflow pipes 138 extend from the upper portions of the housings 36 and 46 back to sump 136. There are also returns 139 which circulate stripper solution to casing 36. An overflow 139 extends from the top of casing 46 to the bottom of casing 36. Heater 141 heats the material in the sump 136 to approximately 100° C.

It is desirable that any photoresist which remains on the surface of the wafer be flushed off, and for such purpose there is mounted on one side of housing 46 adjacent the discharge end 42 a nozzle 146. The nozzle 146 has a plate 147 facing inward of the housing 46 formed with slots 148. Counterbores 149 are formed on the exterior so that there is a jet action of the stripper against the wafer to flush the photoresist away. Pump 137 pumps stripper into nozzle 146. Because of the force of the nozzle action, it is desirable that there be a backing 77 closing off the pockets 66 in housing 46 and supporting the wafer 21 within the pocket against dislodgement. (See FIG. 15A)

Figure 2:
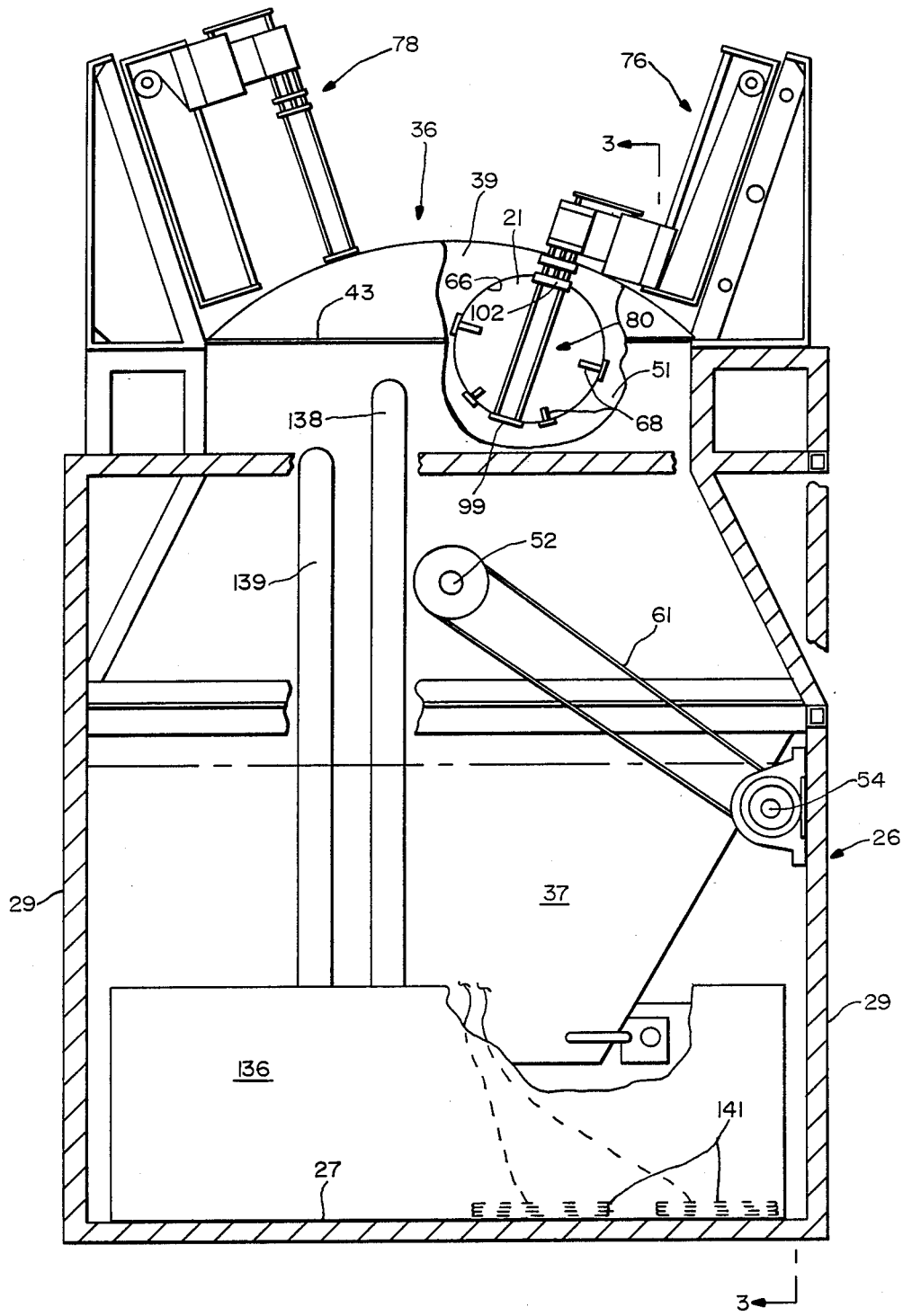
FIG. 2 is a sectional view taken substantially along the line 2—2 of FIG. 1.
Figure 12:
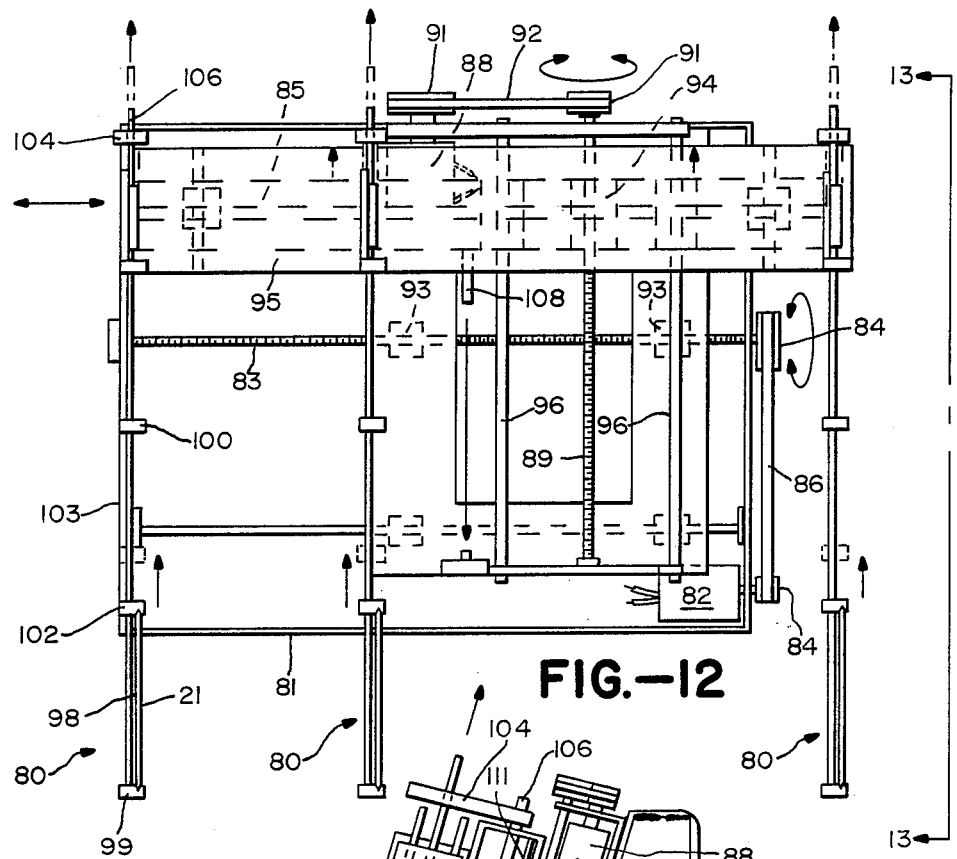
FIG. 12 is an enlarged front elevational view of the lifting mechanism for the wafers.
Figure 13:
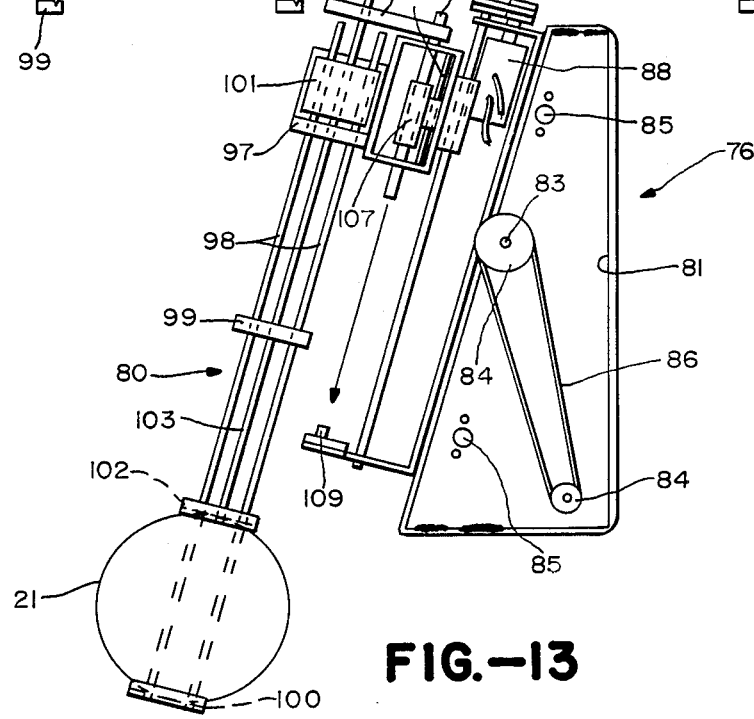
FIG. 13 is an end elevational view of the structure of FIG. 12 as viewed substantially along the line 13—13 of FIG. 12.

A preferred form of transfer device is shown in FIGS. 2, 12, and 13. There is front transfer device 76 along one longitudinal edge of the machine and a rear transfer device 78 on the back of the machine. Other than the spacing between the arms which hold the wafers, the transfer devices 76 and 78 are substantially identical and hence only one such device need be illustrated and described in detail. Thus, as viewed in FIG. 13, there is a base housing 81 which is trapezoidal in shape, one end of the trapezoid resting upon an appropriate shelf on the top of the frame 26. Motor 82 drives a horizontal feedscrew 83 by means of pulleys 84 and belt 86. Horizontal guide rods 85 positioned above and below screw 83 are received in linear bearings fixed to transverse housing 87 to guide the transverse housing 87 for horizontal reciprocation, the housing 87 having nut 93 fixed thereto which is in mating engagement with the screw 83.

Transverse housing 87 is provided with a second motor 88 which drives a vertical feedscrew 89 through pulleys 91 and belt 92. Nut 94 is in threaded engagement with the feedscrew 89 and the housing 95. There are vertical guide rods 96 on either side of screw 89 which are received in linear bearings likewise attached to the housing 95. Thus, as the motors 82 and 88 are energized, they cause the transverse housing 87 to reciprocate horizontally and the housing 95 to reciprocate vertically.

Extending outward from housing 95 are arms 97 which clamp rods 98, the rods being slanted downward-inward so they are at the same angle with respect to the vertical as opening 41 or 42 relative to the axis of shaft 52. Likewise fixed to rods 98 are top guide 99 and bottom stop 100, best shown in FIG. 13. Clamp 101 fixes the upper ends of rods 98 to the arm 97 fixed to housing 95. Gripper 102 reciprocates along rods 98 from the position shown in FIG. 13 to an upper position wherein the gripper 102 is approximately in contact with the upper guide 99. The rod 103 slides through the upper guide 99 and clamp 101, whereas the guide rods 98 are fixed relative thereto. The upper end of rod 103 is attached to arm 104 to which is also attached the upper end of slide rod 106 which reciprocates in slide guide 107 which has linear bearings which slide on parallel shafts 111 fixed to housing 95. (FIG. 13) Normally, the rods 98 and 103 reciprocate together as the housing 95 reciprocates. However, as best shown in FIG. 13, when the push rod 108 engages the abutment 109, guide 107 slides on shafts 111 moving rods 106, arm 104, rod 103 and gripper 102 upward. The gripper 102 rises from its solid line position, shown in FIG. 13, to an upwardly spaced position (not illustrated), thereby releasing the wafer 21 which is shown clamped between the lower stop 100 and the gripper 102. To facilitate the gripping action, the flat 22 of wafer 21 is downmost.

Thus, in the operation of the transfer device, one particular rod 103 is in registry with the input boat 23. The housing 95 is in down position so that the lower end of rod 108 has contacted abutment 109, causing the rod 103 to be in upward position relative to the rods 98 and the gripper 102 being elevated to provide room from a wafer to be received on the stop 100. As the housing 95 is moved upward, the gripper 102 engages and holds the wafer 21 in position by clamping the same against stop 100. The wafer 21 is then lifted as the housing 95 is lifted by the screw 89. Thereupon the screw 83 moves the wafer one station to the right, as viewed in FIG. 12, until the wafer is in registry with the next turret housing 46.

Pocket 116 is interposed between housings 46 and 47. Said pocket 116 is substantially the same as pocket 131, which is disposed to the right of housing 47 in FIG. 1. Pocket 116 may optionally be supplied with alcohol to remove any stripper material which remains on the wafers transferred from housing 46. It is desirable, however, even though no alcohol is supplied in pocket 116, that the wafers being transferred from housing 46 be deposited in the pocket before being transferred to housing 47 so that the same transfer rod 103 does not move directly from housing 46 to housing 47, thereby contaminating the latter.

Walls 117 provide a rectangular cross-section enclosure in pocket 116. The pockets slant upward-outward at the same angle as rods 98, 103. The top of pocket 116 is closed off by nozzles 121 which are pivoted around pivots 123 and are caused to pivot inward by reason of connection to air cylinder 124 through arms 126.

Within the pocket 116 is a wafer support 128, best shown in FIG. 17, having inward directed clips 129 between which the wafer 21 is received. Support 128 has a downward extending tail 127 which is reciprocated by an air cylinder (not shown), slides 130 connected to support 128 which slides on channel-shaped guides 118 on end walls 117 on opposite sides of the pocket 116 and extending up above the pocket (see FIG. 17). The transfer device 76 or 78 deposits a wafer in support 128 when it is in raised position. Tail 127 is then lowered, lowering the wafer inside pocket 116, nozzles 121 pivoting inward.

De-ionized water or other suitable rinse is pumped by a pump (not shown) into nozzles 151 on opposite sides of the area of third housing 47 to rinse solvent off the wafers where the wafer approaches the end of its travel around housing 47. Excess de-ionized water drains back to pump 142 and is then recirculated by a pump 142 to spray nozzles 153. After a wafer is rinsed in housing 47 it is transferred by one of the devices 80 to pocket 131.

In the dryer pocket 131, the inlets 132 are for heated air or nitrogen and the inlets 132 extend across the length of the pocket and have air jets 133 which direct hot air or nitrogen against both surfaces of the wafer 21 to dry the same. In other respects, pocket 131 resembles pocket 116, except that it is oppositely angled.

From the pocket 131 the transfer mechanism transfers the dried wafer to the output boat 134 on the output shelf 32.

OPERATION

At the commencement of operation, a load of wafers 21 in input boat 23 is deposited on the indexer 24 on shelf 31. The forward transfer device 80 (i.e., to the right as viewed in FIG. 2) is actuated. Thus, with the transfer device fully elevated, motor 82 turns screw 83 to move the transverse housing 87 to the right, as viewed in FIG. 12, until the rightmost transfer device 80 is directly above the first wafer 21 in the boat 23. Thereupon the motor 88 turns the screw 89 to lower the first transfer device into the boat so that the bottom stop 100 fits under the wafer 21. As the device 80 lowers, the push rod 108 contacts the stop 109, causing the gripper 102 to remain stationary as stop 100 lowers, permitting the wafer 21 to fit onto the stop 100. Before motor 88 reverses, motor 82 turns screw 83 to move the transverse housing to position gripper 102 and stop 100 over and under the wafer 21, respectively. Motor 88 then reverses, causing the transfer device 80 to be elevated and thereby the gripper 102 engages the top edge of wafer 21 holding it securely in place. After the wafer 21 is fully elevated, motor 82 turns the screw 83 to move the housing 87 one station to the left, as viewed in FIG. 12, until the wafer 21 is directly over the opening 41 in shroud 39 of the first turret housing 36. Thereupon the transfer device 80 is lowered until bottom 108 contacts stop 109, lifting the gripper 102 relative to stop 100 and the wafer 21 is deposited in the appropriate pocket 66 of turret 51, sliding into the clips 68. At this point the detent 69 is in inoperative position because the cam follower 73 is in contact with cam actuator 74. The transverse housing is then moved back to the right a small distance to clear the wafer. The transfer device 80 is then lifted out of the opening 41. Thereupon the motor 57 turns the turret 51 one pocket in radial movement so that the next wafer (which has been advanced one space by indexer 24) may be loaded into the next pocket. Detent 69 is spring-returned to operative position, holding the wafer in its pocket until it approaches opening 42, whereupon a retractable actuator 74 opens the detent. The wafers are carried around immersed in stripper until they reach a position under the opening 42 of the shroud of housing 36. At this point the rear transfer device 80 takes over, enters the opening 42, receives the wafer and lifts the wafer out of the opening 42. Thereupon the rear device motor 82 is energized to move the rear lift arm one station to the opening 41 in the shroud 39 of the second housing 46. The wafer is lowered through the opening 41 and is placed in the appropriate pocket of the turret 51 in housing 46 and the lift arm is removed from housing 46. It will be understood that the turret in the housing 46 turns in a direction opposite that of the turret in housing 36. As the wafer approaches the end of its travel in housing 46, it is flushed of any remaining photoresist by the nozzle 146.

When the wafer is in position under the opening 42 in the shroud of housing 46, a second lift arm of the front set of lift arms is inserted through the opening 42 and lifts the wafer and moves it over to the pocket 116. Pocket 116 may be filled with alcohol to rinse off any remaining stripper or it may be empty. In any event, it is desirable to deposit the wafer in the pocket 116 so that the same lift arm 80 which moves the wafer from housing 46 does not insert the wafer into housing 47.

During the next cycle, the third lift arm of the front set of lift arms raises the wafer out of the pocket 116 and inserts it in the opening 41 of the shroud 39 of the third (rinse) housing 47. The wafer travels around the housing 47, being sprayed with de-ionized water at several positions during its travel and being immersed in DI water substantially continuously. When it reaches the opening 42, the third lift arm of the rear transfer device 80 raises the wafer out of the opening 42 and moves it one station and then lowers it into the pocket 131. In the pocket 131 the wafer is dried by jets of hot air or nitrogen. A final lift arm of the rear transfer device 80 raises the wafer out of the pocket 131 and lowers it into an appropriate slot in the output boat 134 which is resting on indexer 32. Indexer 32 then moves the boat 134 one space.

It will be understood that, although the foregoing operation has been described in tracing the travel of a single wafer through the machine, additional wafers are continually being handled in the same manner, so that at any given time the full capacity of each turret is utilized. The present invention is useful in stripping or cleaning objects other than wafers, such as hard disks, mask glass, compact disks and other thin objects. As used in the claims, "wafer" is intended to include other generally round, thin flat devices. Further, instead of stripping, the apparatus may be used for degreasing, wax cleaning, spray cleaning, post plasma strip cleaning and other treatments simply by choice of proper chemicals. As used in the claims, the term "stripping" is intended to include other surface treatment of thin, flat devices.

What is claimed is:

1. In apparatus for stripping material from a wafer, a stripping turret formed with a plurality of pockets each shaped to receive a wafer and having retainer means for each said pocket to retain a wafer in said pocket, mounting means for supporting said stripping turret for rotation about a horizontal axis, a stripper housing surrounding said stripping turret, said stripper housing having first and second radially spaced aperture-forming means, each said aperture forming means being located adjacent the top of said housing and on opposite sides of a vertical plane through said horizontal axis, drive means for rotating said stripping turret a distance equal to one pocket at a time so that each said pocket is brought under one of said aperture-forming means sequentially, first transfer means for inserting one wafer at a time substantially downwardly in a vertical plane into one of said pockets through said first aperture-forming means, second transfer means for removing one wafer at a time upwardly in a vertical plane from one of said pockets through said second aperture-forming means and pumping means for supplying stripper solvent to said stripper housing.

2. Apparatus according to claim 1 which further comprises means for supporting a first boat on a first side of said stripping turret and means for supporting a second boat on the second side of said stripping turret, each said boat being of the type to hold a plurality of wafers in side by side relation, said first transfer means being adapted to remove one wafer at a time from said first boat and one of said transfer means being adapted to transfer one wafer at a time into said second boat.

3. Apparatus according to claim 1 in which said aperture-forming means has a first opening and a second opening, said openings being on opposite sides of a vertical central plane through the axis of rotation of said stripping turret, said first transfer means being on a first side of said plane and said second transfer means being on a second side of said plane opposite said first side, said first transfer means inserting wafers through said first opening and said second transfer means removing wafers through said second opening.

4. Apparatus according to claim 1 in which said turret comprises a circular disc member formed adjacent its periphery with a plurality of substantially circular holes slightly larger than the diameter of said wafer, a rim fixed to one side of said disc member, and a plurality of clips fixed to said rim each shaped to engage a portion of the edge of said wafer.

5. Apparatus according to claim 4 in which clips are all disposed inwardly of the center of said wafer and which further comprises a detent fixed to said rim adjacent the periphery of said disc member, said detent having a first position blocking inward and outward movement of said wafer relative to said pocket and a second position permitting movement of said wafer relative to said pocket.

6. Apparatus according to claim 5 in which said detent is biased toward first position and which further comprises a retractable actuator fixed interiorly of said casing adjacent said aperture forming means and a cam follower on said detent whereby when said retractable actuator and cam follower are in contact said detent is moved to second position.

7. In apparatus for stripping materials from a wafer, a stripping turret formed with a plurality of pockets each shaped to receive a wafer and having retainer means for each said pocket to retain a wafer in said pocket, mounting means for supporting said stripping turret for rotation about a horizontal axis, a stripper housing surrounding said stripping turret, said stripper housing having first and second radially spaced aperture-forming means in its upper portion, drive means for rotating said stripping turret a distance equal to one pocket at a time so that each said pocket is brought under one of said aperture-forming means sequentially, first transfer means for inserting one wafer at a time in a vertical plane into one of said pockets through said first aperture-forming means, second transfer means for removing one wafer at a time in a vertical plane from one of said pockets through said second aperture-forming means and pumping means for supplying stripper solvent to said stripper housing, a rinse turret parallel to said stripping turret formed with a plurality of second pockets each shaped to receive a wafer and having second retainer means for each said second pocket to retain a wafer in said second pocket, said mounting means supporting said rinse turret for rotating said rinse turret about a horizontal axis, a rinse housing surrounding said rinse turret, said rinse turret having third and fourth radially spaced aperture-forming means in its upper portion, said drive means rotating said rinse housing in synchronism with said stripping turret, one of said transfer means inserting one wafer at a time, after it has been removed from said stripping turret, into one of said second pockets through said third aperture-forming means and the other of said transfer means removing one wafer at a time through said fourth aperture-forming means and second pumping means for pumping rinsing liquid into said rinse housing.

8. Apparatus according to claim 7 which further comprises means forming a third pocket disposed in a vertical plane interposed between said stripper housing and said rinse housing and parallel to said stripper housing shaped to receive a wafer, said third pocket having an opening in its top, and single wafer supporting means within said third pocket.

9. Apparatus according to claim 8 which further comprises means forming a fourth pocket on the side of said rinse housing opposite said stripper housing shaped to receive a wafer, said fourth pocket having an opening in its top, single wafer supporting means within said fourth pocket, and means for supplying gaseous fluid to said fourth pocket to dry said wafer.

10. Apparatus according to claim 9 and which further comprises at least one nozzle closing off said opening, pivot means mounting said nozzle on said fourth pocket and means for opening and closing said nozzle.

11. Apparatus according to claim 8 in which at least one said transfer means has at least a first and a second transfer device, said first transfer device inserting a wafer into said third pocket through said opening and said second transfer device removing the same wafer from said third pocket through said opening, whereby any stripper solvent on said first transfer device does not contaminate said wafer during or after removal of said wafer from said third pocket through said opening.

12. Apparatus according to claim 7 which further comprises a second stripping turret parallel and adjacent to said first mentioned stripping turret formed with a plurality of third pockets each shaped to receive a wafer and having third retainer means for each said third pocket to retain a wafer in said third pocket, said mounting means supporting said second stripping turret for rotating said second stripping turret about a horizontal axis, a second stripper housing surrounding said second stripping turret having fifth and sixth radially spaced aperture forming means in its upper portion, said drive means rotating said second stripping turret in synchronism with said first-mentioned stripping turret but in the opposite direction of rotation, one said transfer means inserting one wafer at a time, after it has been removed from said first stripping turret, into one of said third pockets through said fifth aperture-forming means and the other said transfer means removing one wafer at a time through said sixth aperture-forming means, said first-mentioned pumping means pumping stripper solvent to said second stripper housing.

13. Apparatus according to claim 12 which further comprises a pressure nozzle mounted on the side of and communicating with said second stripper housing to flush material off each said wafer as it approaches the end of its travel through said second stripping housing.

14. Apparatus according to claim 13 in which said pressure nozzle has a plate formed with narrow elongated slits, said plate being disposed parallel to the path of travel of said wafers.

15. Apparatus according to claim 12 in which said first, third and sixth aperture-forming means and said second, fourth and fifth aperture-forming means are on opposite sides of a vertical central plane through a horizontal axis of rotation of one of said turrets, said first transfer means being on a first side of said plane and said second transfer means being on a second side of said plane opposite said first side, said first transfer means inserting wafers through said first, fifth and third aperture-forming means of said first stripping turret, said second stripping turret and said rinse turret, respectively, said second transfer means removing wafers from said second, sixth and fourth aperture-forming means of said first stripping turret, said second stripping turret and said rinse turret, respectively.

16. Apparatus according to claim 15 in which said first transfer means removes the same wafer from said fifth aperture forming means of said second stripper housing.

17. Apparatus according to claim 16 in which at least said first transfer means has at least two transfer devices, one said device inserting said wafers into said first-mentioned stripper housing and another said device removing wafers from said second stripper housing.

18. Apparatus according to claim 15 in which one said transfer device removes wafers from said sixth aperture-forming means of said second stripper housing and transfers wafers from said second stripper housing to a rinse housing and thence from said rinse housing to said fifth aperture-forming means.

19. Apparatus according to claim 18 which further comprises a pocket interposed between said second stripper housing and said rinse housing shaped to receive a wafer, said pocket having an opening at its top and single wafer support means within said pocket, one said transfer means removing a wafer from said second stripper housing and inserting said wafer into said pocket and then removing said wafer from said pocket and inserting said wafer in said rinse housing.

* * * * *